(12) United States Patent
Shinohira

(10) Patent No.: US 6,671,637 B2
(45) Date of Patent: Dec. 30, 2003

(54) THRUST RIPPLE MEASURING APPARATUS AND METHOD IN LINEAR MOTOR

(75) Inventor: Daisuke Shinohira, Tokyo (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 100 days.

(21) Appl. No.: 10/057,988

(22) Filed: Jan. 29, 2002

(65) Prior Publication Data

US 2003/0144805 A1 Jul. 31, 2003

(51) Int. Cl.[7] ............ G06F 19/00; G05B 5/00; G05B 13/00
(52) U.S. Cl. ............ 702/65; 702/33; 702/34; 700/45; 318/561
(58) Field of Search .......... 702/33, 34, 35, 702/36, 41, 64, 65, 81, 84, 96, 142, 145; 700/42, 44, 45, 56; 318/625, 649, 561, 135

(56) References Cited

U.S. PATENT DOCUMENTS

| | | |
|---|---|---|
| 5,838,079 A * 11/1998 | Morohashi et al. | 310/12 |
| 6,584,367 B1 * 6/2003 | Makino et al. | 700/60 |
| 2003/0097193 A1 * 5/2003 | Makino et al. | 700/42 |

* cited by examiner

*Primary Examiner*—Bryan Bui
(74) *Attorney, Agent, or Firm*—Arent Fox Kintner Plotkin & Kahn

(57) ABSTRACT

In a thrust ripple measuring apparatus for use in a linear motor, a slave linear motor as a subject to be measured is coupled with a master linear motor through a non-contact type stage mechanism. A processing unit is supplied with speed-induced-voltages detected by a voltage detector and a moving speed of the slave linear motor detected by a speed detector and calculates a per-phase induced voltage constant from the ratio of the speed-induced-voltage of each phase and the moving speed and further calculates a thrust constant and a thrust ripple from the calculated per-phase induced voltage constant.

8 Claims, 5 Drawing Sheets

THRUST RIPPLE MEASURING APPARATUS AND METHOD IN LINEAR MOTOR

BACKGROUND OF THE INVENTION

1. Field of the Invention

The present invention relates to apparatus and method of measuring characteristics of a linear motor, and more particularly, to apparatus and method of measuring a thrust constant and a thrust ripple in a linear motor.

2. Description of the Related Art

An example of a linear motor will be briefly described with reference to FIGS. 1 and 2. In the linear motor, a fixed yoke 10 having an approximately U-shaped cross section is disposed on a base (not shown) so as to extend in a traveling direction. A moving body, for example, a coupling member 20, which is coupled with a stage, is disposed above the fixed yoke 10 so as to slide in the traveling direction. A movable coil section 21 is disposed under the coupling member 20. Permanent magnets 11 are fixed on the two inner surfaces of the fixed yoke 10 in the traveling direction at intervals, respectively, so as to face the two main surfaces of the movable coil section 21 through gaps.

Note that, in the case of a three-phase linear motor, the linear motor includes coils for three phases, that is, a U-phase, a V-phase, and a W-phase.

In the linear motor, electromagnetic force is generated by the mutual action between the magnetic flux from the permanent magnets 11 and the current flowing in the movable coil section 21 and causes the coupling member 20 and the movable coil section 21 to travel together.

The linear motor arranged as described above is used as a drive source of an X-Y stage apparatus in place of a ball thread mechanism because the linear motor can make positioning more accurately and generate a high thrust.

Incidentally, in this type of linear motors, a thrust constant and a thrust ripple are measured in a manufacturing process as factors for measuring characteristics thereof to know their performance.

A conventional method of measuring the thrust constant and the thrust ripple of a three-phase linear motor will be described with reference to FIG. 3. In FIG. 3, a load cell 41 is pressed against the movable section 31 (for example, the coupling member 20 in FIG. 1) of a linear motor as a subject to be measured. The load cell 41 is mounted on a stage 43 capable of measuring a moving distance by a micrometer 42. Then, the movable section 31 of the linear motor is pulled in a direction where it is pressed against the load cell 41 by a spring 44 such as a coil spring. A yoke 30 corresponds to the fixed yoke 10 in FIG. 1.

A given current is supplied to the coils of the respective phases (U-phase, V-phase, and W-phase) in the linear motor using the apparatus arranged as described above. At the time, a force necessary to prohibit the movement of the movable section 31 is repeatedly measured by the load cell 41 at the respective points of a plurality of permanent magnets disposed in a traveling direction. As a result, a thrust constant is obtained as an output signal from the load cell 41. In contrast, a thrust ripple is a difference (variable component) between the value obtained by subjecting the thrust constants of the respective phases to sine excitation, that is, the value obtained by combining the thrust constants of the three phases and a predetermined thrust.

FIG. 4A shows the thrust constants of the respective phases that are obtained as the output signals from the load cell 41. FIG. 4B shows the value obtained by combining the thrust constants of the three phases in FIG. 4A as the thrust ripple.

Note that the thrust constant and the thrust ripple may be measured by the following method in place of the method performed using the apparatus shown in FIG. 3.

With reference to FIG. 5, a linear motor as a subject to be measured is prepared as a slave linear motor 51 as well as a master linear motor 52 is used. The slave linear motor 51 is coupled with the master linear motor 52 through a contact type guide mechanism 53 such as a bearing mechanism. The guide mechanism 53 can move along a guide rail 54.

When the master linear motor 52 is actuated, voltages are induced in the coils of the respective phases in the slave linear motor 51 in correspondence to the moving speed thereof, and the voltages (hereinafter, referred to as "speed-induced-voltages") and the moving speed are measured. Then, a per-phase induced voltage constant is calculated from the ratio of the measured speed-induced-voltage of each phase and the moving speed. Further, the thrust constant and the thrust ripple are calculated from the thus obtained per-phase induced voltage constant of each phase.

In the method of measuring the thrust constant and the thrust ripple using the apparatus of FIG. 3, however, an error is included in the thrust constant and the thrust ripple due to the accuracy of a sensor such as the micrometer 42.

In contrast, the measuring method shown in FIG. 5 also lacks accuracy in measurement because the guide mechanism 53 is arranged as the contact type. Further, the thrust ripple cannot be accurately evaluated quantitatively because the drive system employed in the method is different from an actual drive system.

SUMMARY OF THE INVENTION

Accordingly, an object of the present invention is to improve a measuring accuracy in apparatus and method of measuring a thrust constant and a thrust ripple that determine the performance of a linear motor used to drive a stage.

A thrust ripple measuring apparatus according to the present invention is used for a linear motor. According to an aspect of the present invention, the apparatus comprises a master linear motor for driving a slave linear motor as a subject to be measured. A non-contact type stage mechanism couples the slave motor with the master motor. A voltage detector detects speed-induced-voltages generated in coils of the respective phases of the slave linear motor and a speed detector detects a moving speed of a movable portion in the slave linear motor when the master linear motor is actuated. A processing unit is supplied with the detected speed-induced-voltages and the detected moving speed and calculates a per-phase induced voltage constant from the ratio of the detected speed-induced-voltage of each phase and the detected moving speed of the slave linear motor. The processing unit further calculates a thrust constant and a thrust ripple from the calculated per-phase induced voltage constant.

According to a thrust ripple measuring method of the present invention, an apparatus is prepared in which a slave linear motor as a subject to be measured is coupled with a master linear motor for driving the slave linear motor through a non-contact type stage mechanism. When the master linear motor is actuated, speed-induced-voltages generated in coils of the respective phases of the slave linear motor are detected. At this time, a moving speed of the slave linear motor is detected. A per-phase induced voltage constant is calculated from the ratio of the detected speed-induced-voltage of each phase and the detected moving speed of the slave linear motor. A thrust constant and a thrust ripple is further calculated from the calculated per-phase induced voltage constant.

DESCRIPTION OF THE PREFERRED EMBODIMENTS

Figure 6:
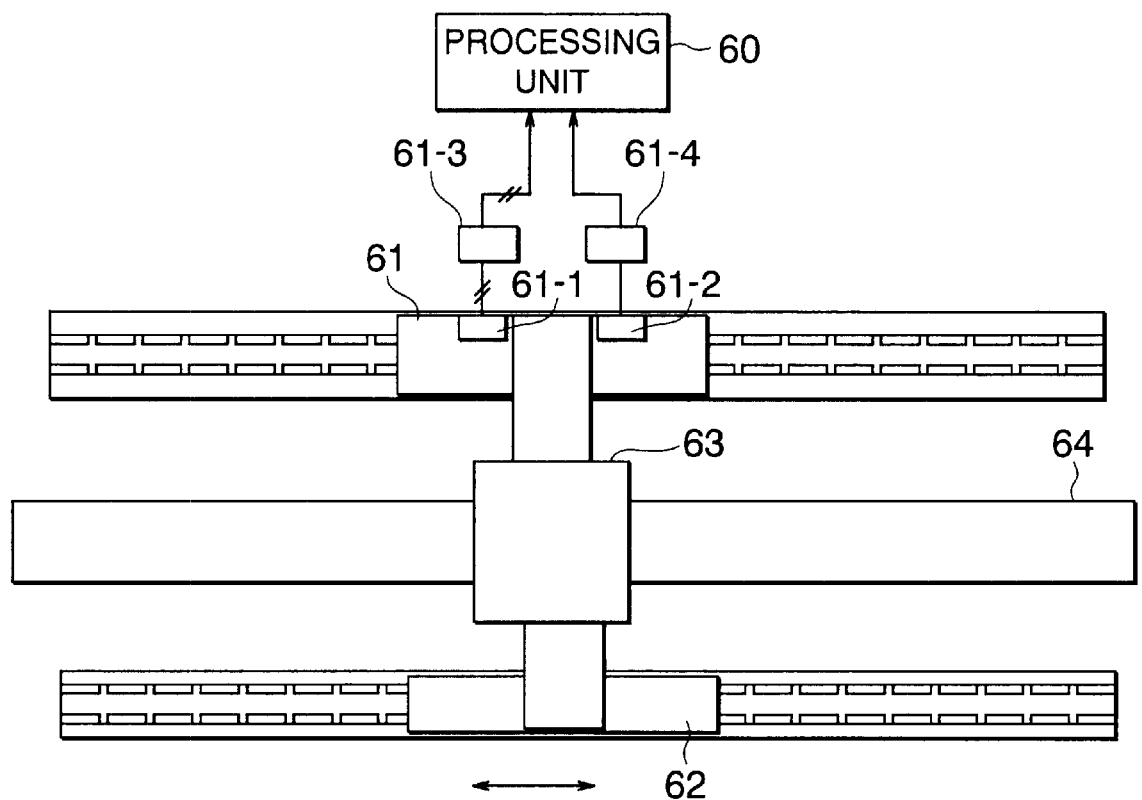
FIG. 6 is a view schematically showing the arrangement of an apparatus used in a ripple measuring method of an embodiment of the present invention.

A ripple measuring apparatus according to an embodiment of the present invention will be described with reference to FIGS. 6 and 7. The embodiment is characterized in that measurement is performed using the apparatus as shown in FIG. 6 to effectively perform the measurement and to improve accuracy. In this apparatus, a linear motor as a subject to be measured (hereinafter, referred to as a "slave linear motor") 61 is coupled with a linear motor (hereinafter, referred to as a "master linear motor") 62 symmetrically with respect to a linear guide rail 64 of a stage mechanism 63 through a non-contact type stage mechanism 63.

In the embodiment, both the slave linear motor 61 and the master linear motor 62 are the three-phase linear motors. The slave linear motor 61 is provided with a voltage detector 61-3 for detecting the speed-induced-voltages which are generated in the respective three-phase coils. The slave linear motor 61 also provided with a speed detector 61-2 for detecting the speed thereof. The speed detector 61-2 may be implemented by a combination of a linear encoder and a differentiator. This is because the linear motor is provided with a linear encoder for detecting a position of a movable portion thereof. A speed value can be calculated by differentiating an output of the linear encoder. Outputs of the voltage detector 61-1 and the speed detector 61-2 are analog signals. The outputs of the voltage detector 61-1 and the speed detector 61-2 are converted into digital signals by analog/digital converters 61-3 and 61-4, respectively. Converted digital signals are inputted to a processing unit 60. The processing unit 60 is implemented by, for example, a personal computer, and calculates a thrust constant and a thrust ripple by carrying out the calculation described later.

Figure 7:
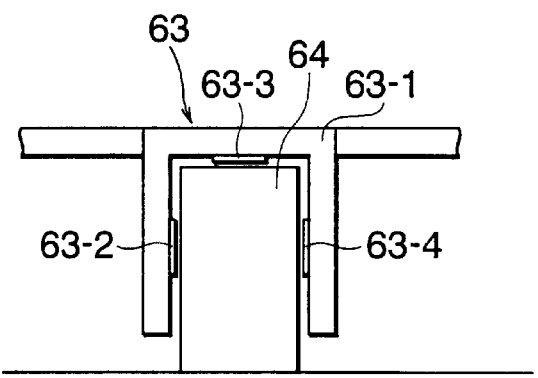
FIG. 7 is a side view explaining a guide system of a stage mechanism shown in FIG. 6.

As shown in FIG. 7, the non-contact type stage mechanism 63 employs a plurality of static pressure air bearings 63-2, 63-3, and 63-4 to support a movable section 63-1 acting as a stage. That is, the linear guide rail 64 has a square cross section, and two side surfaces and an upper surface thereof are used as guide surfaces. In contrast, the movable section 63-1 has an approximately inverted-U-shaped cross section including three inner surfaces facing the two side surfaces and the upper surface of the linear guide rail 64. Then, the static pressure air bearings 63-2, 63-3, and 63-4 are disposed on these three inner surfaces, respectively. The static pressure air bearings 63-2, 63-3, and 63-4 eject compressed air onto the two side surfaces and the upper surface of the linear guide rail 64, respectively. As a result, the movable section 63-1 can move without coming into contact with the linear guide rail 64.

Note that a plurality of static pressure air bearings may be disposed on each inner surface of the movable section 63-1. Further, a dedicated combination of the master linear motor 62 and the stage mechanism 63 is prepared to realize the measuring method according to the present invention.

In the embodiment, the constant speed property of the master linear motor 62 is secured by employing a disturbance observer control system to control the drive of the master linear motor 62.

Figure 8:
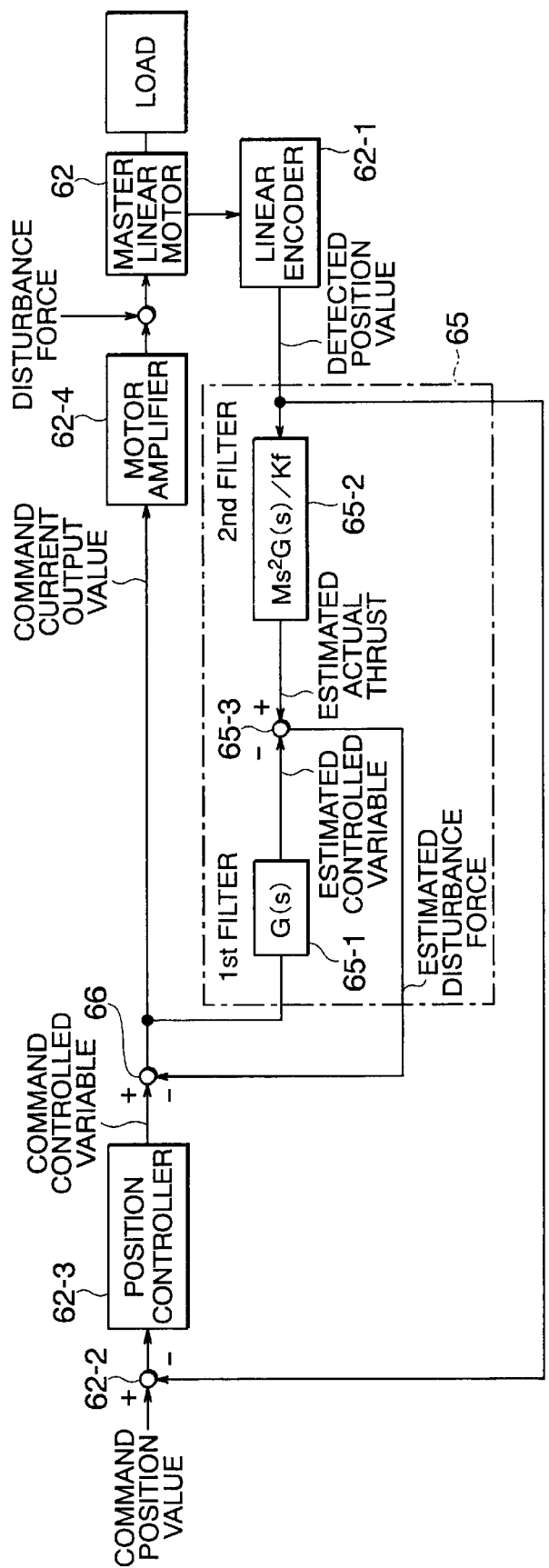
FIG. 8 is a view showing the arrangement of a drive control system of a master linear motor in the apparatus shown in FIG. 6.

The disturbance observer control system will be described with reference to FIG. 8. In FIG. 8, the master linear motor 62 is driven under the control of a feedback control system. As known well, a linear motor is provided with a linear encoder for detecting a position of a movable portion. The master linear motor 62 of the embodiment is also provided with a linear encoder 62-1. The feedback control system includes the linear encoder 62-1 provided to the master linear motor 62, a first subtractor 62-2 for calculating a difference between a position value detected (hereinafter, referred to as a "detected position value") by the linear encoder 62-1 and the value of a commanded position (hereinafter, referred to as a "command position value"), a position controller 62-3, and a motor amplifier 62-4.

In the control of the drive of the master linear motor 62, the detected position value from the linear encoder 62-1 is fed back to the first subtractor 62-2, the first subtractor 62-2 calculates the difference between the detected position value and the command position value, and the thus calculated difference is supplied to the position controller 62-3. The position controller 62-3 generates a command value of a controlled variable based on the calculated difference.

A disturbance compensator composed of a combination of a disturbance observer 65 and a second subtractor 66 is added to the control loop of the feedback control system. The disturbance compensator is used to cancel disturbance factors such as the variation of the characteristics of the master linear motor 62 and the stage mechanism 63. The second subtractor 66 has two input terminals. One of the input terminals is connected to the output of the position controller 62-3, and the other of the input terminals is connected to the output of a third subtractor 65-3 which will be described later. Further, the output of the second subtractor 66 is connected to the motor amplifier 62-4. As a result, the command value of a current output from the disturbance compensator is supplied to the motor amplifier 62-4. The motor amplifier 62-4 drives the master linear motor 62 based on the command value of the current supplied thereto.

Next, the disturbance compensator will be described. The disturbance observer 65 includes a first filter 65-1 composed of a secondary low-pass filter (Gs), a second filter 65-2, and the third subtractor 65-3. The second filter 65-2 is composed of an inverse model ($Ms^2/Kf$) of the subject to be controlled, which approximates to the master linear motor 62 and a load, and a secondary low-pass filter (Gs). Note that "Ms" denotes the mass of the master linear motor 62 and the load, that is, the mass of the movable section of the stage mechanism 63, and "Kf" denotes a motor thrust constant. The input of the first filter 65-1 is connected to the output of the second subtractor 66, the input of the second filter 65-2 is connected to the output of the linear encoder 62-1. Two inputs of the third subtractor 65-3 is connected to the output of the first filter 65-1 and to the output of the second filter 65-2. The third subtractor 65-3 calculates the difference between the outputs from the first and second filters 65-1 and 65-2. The calculated difference is supplied to the second subtractor 66.

The disturbance observer 65 filters the command value of the controlled variable using the first filter 65-1 and outputs an estimated value of the controlled variable. Further, the disturbance observer 65 estimates the command value of an actual thrust applied to the subject to be controlled from the detected position value detected by the linear encoder 62-1 using the second filter 65-2 and outputs an estimated value of the actual thrust. Then, the disturbance observer 65 estimates a disturbance force applied to the subject to be controlled by calculating the difference between the outputs from the first and second filters 65-1 and 65-2 using the third subtractor 65-3 and outputs the estimated value of the disturbance force. The second subtractor 66 compensates the disturbance force by subtracting the estimated value of the disturbance force from the command value of the controlled variable.

As described above, when the model composed of the mass of the master linear motor 62 and the load is used as the model of the subject to be controlled in the estimation of the actual thrust, the variation of guide friction and the like in the stage mechanism 63 can be estimated as the disturbance force and compensated.

As described above, in the embodiment, the disturbance compensator using the disturbance observer 65 can estimate the variation of the guide friction and the like, which vary at the position of the movable section of the stage mechanism 63, as the disturbance force and compensate the disturbance factors.

Figure 1:
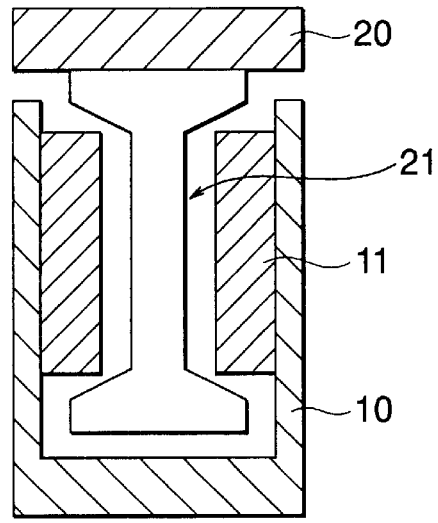
FIG. 1 is a sectional view for explaining the schematic arrangement of a linear motor.
Figure 2:
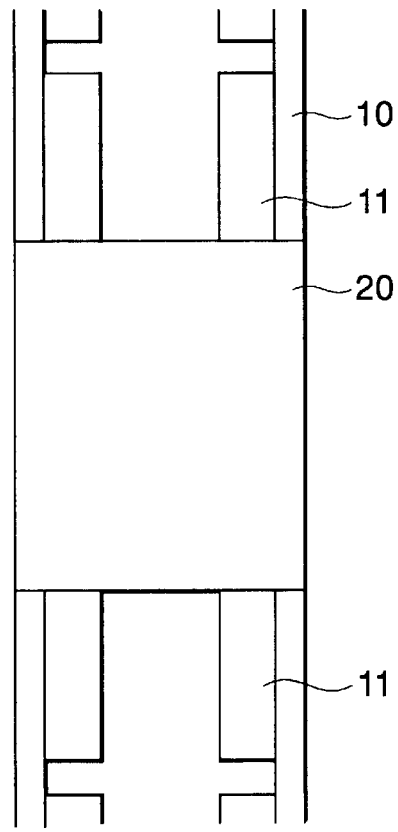
FIG. 2 is a plan view of the linear motor shown in FIG. 1.
Figure 3:
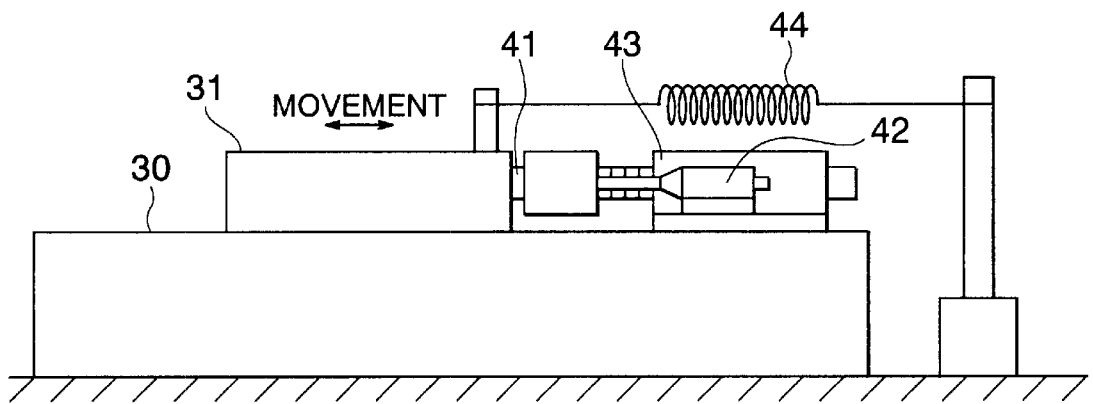
FIG. 3 is a view explaining a first example a conventional ripple measuring method.
Figure 4A:
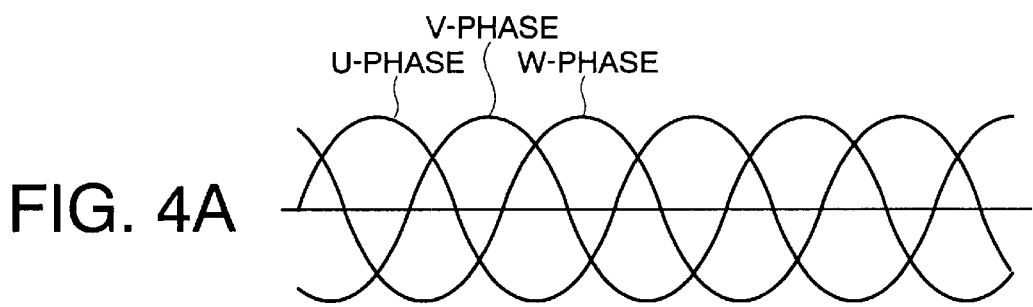
FIGS. 4A and 4B are graphs showing signal waveforms obtained by the ripple measuring method of FIG. 3.
Figure 4B:
Figure 5:
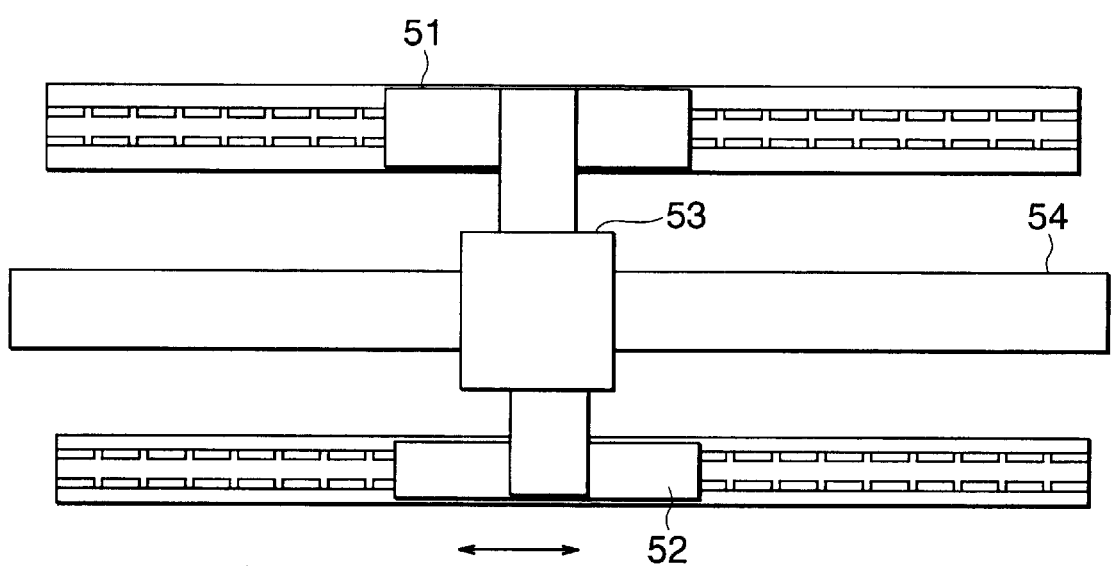
FIG. 5 is a view explaining a second example of the conventional ripple measuring method.

At first, the master linear motor 62 is actuated under the observer control using the apparatus shown in FIG. 6 and the drive control system shown in FIG. 8 as well as using the non-contact type stage mechanism 63 as a guide system. When the slave linear motor (movable coil) 61 is moved in the permanent magnet train at a given speed, the speed-induced-voltages induced in the three-phase coils are detected by the voltage detector 61-1, and the moving speed of the movable portion in the slave motor 61 is detected by the speed detector 61-2. By the use of the outputs of the voltage detector 61-1 and the speed detector 61-2 through the analog/digital converters 61-3 and 61-4, the processing unit 60 calculates a per-phase induced voltage constant that is a ratio of the effective value of the fundamental wave component of the speed-induced-voltages and the moving speed of the slave linear motor 61. The processing unit 60 further calculates a thrust constant based on the per-phase induced voltage constant. The thrust constant is an average of thrust values, and the thrust values are calculated by a known calculation method based on electromagnetic force. That is, when an induced voltage is found, a thrust can be known. Each sine wave of the respective phases of the three-phase linear motor is $(3/2)\pi$ out of phase. Thus, the thrust ripple can be obtained by determining the sum of the voltages of the three phases at respective points of time. That is, when the sum of the values of the respective phases is 0 at a certain point of time, the thrust ripple is 0. Otherwise, the thrust ripple having a certain value is detected. The per-phase induced voltage and the thrust ripple have waveforms similar to those shown in FIGS. 4A and 4B, respectively.

As mentioned above, the thrust constant and the thrust ripple are automatically calculated by the processing unit 60 by the use of the speed-induced-voltages generated in the respective three-phase coils and the speed of the slave linear motor 61.

According to the apparatus of measuring the thrust constant and the thrust ripple according to the present invention, the thrust ripple can be measured at a high accuracy by employing the non-contact type stage mechanism in the guide system and by using the disturbance observer control to secure the constant speed property of the master linear motor.

What is claimed is:

1. A thrust ripple measuring apparatus in a linear motor, comprising:

a master linear motor for driving a slave linear motor as a subject to be measured; a non-contact type stage mechanism for coupling the slave motor with the master motor;

a voltage detector for detecting speed-induced-voltages generated in coils of the respective phases of the slave linear motor when the master linear motor is actuated;

a speed detector for detecting a moving speed of a movable portion in the slave linear motor; and a processing unit supplied with the detected speed-induced-voltages and the detected moving speed;

the processing unit calculating a per-phase induced voltage constant from the ratio of the detected speed-induced-voltage of each phase and the detected moving speed of the slave linear motor, and calculating a thrust constant and a thrust ripple from the calculated per-phase induced voltage constant.

2. A thrust ripple measuring apparatus in a linear motor according to claim 1, wherein the non-contact type stage mechanism is that a movable section thereof is supported by a plurality of static pressure air bearings.

3. A thrust ripple measuring apparatus in a linear motor according to claim 2, wherein the master linear motor is controlled by a feedback control system which comprises:

a linear encoder for detecting a position and provided with the master linear motor;

a first subtractor for calculating a difference between the value of a position detected by the linear encoder and the value of a command position;

a position controller connected to the output of the first subtractor for outputting the command value of a controlled variable; and a motor amplifier connected to the output of the position controller, and the feedback control system further comprises a disturbance compensator for compensating a disturbance force due to the movable section of the stage mechanism to thereby secure the continuous speed property of the master linear motor.

4. A thrust ripple measuring apparatus in a linear motor according to claim 3, wherein the disturbance compensator comprises:

a second subtractor having two inputs one of which is connected to the output of the position controller;

a first filter connected to the output of the second subtractor for determining an estimated value of a controlled variable based on the command value of the controlled variable;

a second filter connected to the output of the linear encoder for determining an estimated value of an actual thrust based on the detected position value; and a third subtractor connected to the output of the first filter and to the output of the second filter for calculating a difference between the estimated value of the controlled variable and the estimated value of the actual thrust as an estimated value of a disturbance force, wherein the other of the two inputs of the second subtractor is connected to the output of the third subtractor to thereby output the value obtained by subtracting the estimated value of the disturbance force from the commanded value of the controlled variable to the motor amplifier.

5. A thrust ripple measuring method in a linear motor, comprising the steps of:

preparing an apparatus in which a slave linear motor as a subject to be measured is coupled with a master linear motor for driving the slave linear motor through a non-contact type stage mechanism;

detecting speed-induced-voltages generated in coils of the respective phases of the slave linear motor and a moving speed of the slave linear motor when the master linear motor is actuated;

calculating a per-phase induced voltage constant from the ratio of the detected speed-induced-voltage of each phase and the detected moving speed of the slave linear motor; and calculating a thrust constant and a thrust ripple from the calculated per-phase induced voltage constant.

6. A thrust ripple measuring method in a linear motor according to claim 5, wherein the non-contact type stage mechanism is that a movable section thereof is supported by a plurality of static pressure air bearings.

7. A thrust ripple measuring method in a linear motor according to claim 6, wherein the master linear motor is controlled by a feedback control system which comprises:

a linear encoder for detecting a position and provided with the master linear motor;

a first subtractor for calculating a difference between the value of a position detected by the linear encoder and the value of a command position;

a position controller connected to the output of the first subtractor for outputting a command value of a controlled variable; and a motor amplifier connected to the output of the position controller, and the feedback control system further comprises a disturbance compensator for compensating a disturbance force due to the movable section of the stage mechanism to thereby secure the continuous speed property of the master linear motor.

8. A thrust ripple measuring method in a linear motor according to claim 7, wherein the disturbance compensator comprises:

a second subtractor having two inputs one of which is connected to the output of the position controller;

a first filter connected to the output of the second subtractor for determining an estimated value of a controlled variable based on the commanded value of the controlled variable;

a second filter connected to the output of the linear encoder for determining an estimated value of an actual thrust based on the detected position value; and a third subtractor connected to the output of the first filter and to the output of the second filter for determining a difference between the estimated value of the controlled variable and the estimated value of the actual thrust as an estimated value of a disturbance force, wherein the other of the two inputs of the second subtractor is connected to the output of the third subtractor to thereby output the value obtained by subtracting the estimated value of the disturbance force from the command value of the controlled variable to the motor amplifier.

* * * * *